United States Patent
Park

(10) Patent No.: US 7,803,029 B2
(45) Date of Patent: Sep. 28, 2010

(54) METHOD OF FABRICATING ORGANIC ELECTROLUMINESCENT DISPLAY DEVICE

(75) Inventor: Jae-Yong Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 41 days.

(21) Appl. No.: 12/289,087

(22) Filed: Oct. 20, 2008

(65) Prior Publication Data

US 2009/0130786 A1 May 21, 2009

Related U.S. Application Data

(62) Division of application No. 11/023,780, filed on Dec. 29, 2004, now Pat. No. 7,521,859.

(30) Foreign Application Priority Data

Dec. 30, 2003 (KR) .......................... 2003-0099856

(51) Int. Cl.
*H01L 21/02* (2006.01)

(52) U.S. Cl. .......................... 445/24; 313/506; 438/618

(58) Field of Classification Search .................. 445/24; 438/619; 313/506
See application file for complete search history.

(56) References Cited

U.S. PATENT DOCUMENTS

| 5,635,308 | A | 6/1997 | Inoue et al. ................ 428/696 |
| 5,998,805 | A | 12/1999 | Shi et al. ...................... 257/40 |
| 6,525,704 | B1 | 2/2003 | Kondo et al. .................. 345/78 |
| 6,921,918 | B2 | 7/2005 | Park et al. ..................... 257/72 |
| 6,972,517 | B2 | 12/2005 | Park .......................... 313/504 |
| 2001/0003629 | A1 | 6/2001 | Toguchi et al. .............. 313/504 |
| 2002/0153844 | A1 | 10/2002 | Koyama .................. 315/169.3 |
| 2003/0127650 | A1 | 7/2003 | Park et al. ..................... 257/72 |
| 2004/0130516 | A1 | 7/2004 | Nathan et al. ................. 345/82 |
| 2005/0140290 | A1 | 6/2005 | Park et al. ................... 313/512 |

FOREIGN PATENT DOCUMENTS

KR     2003-0057070     7/2003

*Primary Examiner*—Peter Macchiarolo
(74) *Attorney, Agent, or Firm*—Morgan, Lewis & Bockius LLP

(57) ABSTRACT

An organic electroluminescent display device includes an array element layer formed on a substrate, the array element layer including a switching element, a driving element, a first electrode, an organic luminescent layer, and a second electrode, and a ground line formed on the substrate, the ground line directly contacting the second electrode.

7 Claims, 16 Drawing Sheets

METHOD OF FABRICATING ORGANIC ELECTROLUMINESCENT DISPLAY DEVICE

This application is a divisional application of application Ser. No. 11/023,780, filed on Dec. 29, 2004 now U.S. Pat. No. 7,521,859, which claims the benefit of Korean Patent Application No. 2003-0099856 filed in Korea on Dec. 30, 2003, both of which are incorporated by reference in their entirety.

BACKGROUND OF THE INVENTION

1. Field of the Invention

The present invention relates to a display device, and more particularly, to an organic electroluminescent (EL) display device and a method of fabricating the same.

2. Discussion of the Related Art

An organic electroluminescent (EL) display device, which is a type of flat panel display, is a self-emission type display. In general, the organic EL display device emits light by injecting electrons from a cathode and holes from an anode into an emission layer, combining the electrons with the holes, generating an exciton, and transitioning the exciton from an excited state to a ground state. Accordingly, the organic EL display device does not require an additional light source and has a light weight, thin profile, and compact size.

The organic EL display device also has other excellent characteristics such as low power consumption, superior brightness, fast response time and simple fabrication process. As a result, the organic EL display device is regarded as a promising display for next-generation consumer electronic applications, such as cellular phones, car navigation systems (CNS), personal digital assistants (PDA), camcorders, and palmtop computers.

There are two types of organic EL display devices: passive matrix type and active matrix type. While both the passive matrix organic EL display device and the active matrix organic EL display device have simple structures and are formed by a simple fabricating process, the passive matrix organic EL display device requires a relatively high amount of power to operate. In addition, the display size of a passive matrix organic EL display device is limited by its structure. Furthermore, as the number of conductive lines increases, the aperture ratio of a passive matrix organic EL display device decreases. In contrast, active matrix organic EL display devices are highly efficient and can produce a high-quality image for a large display with a relatively low power.

FIG. 1 is a schematic cross-sectional view of an organic electroluminescent display device according to the related art. In FIG. 1, an organic EL display device 10 includes first and second substrates 12 and 28 attached to each other by a sealant 26 with a space therebetween. An array element layer 14 is formed on the first substrate 12 and includes a thin film transistor (TFT) T. In addition, a first electrode 16, an organic luminescent layer 18 and a second electrode 20 are formed on the array element layer 14. The first electrode 16 is connected to the TFT T. The organic EL layer 18 may separately display red, green, and blue colors in each pixel region P.

The organic EL display device 10 is encapsulated by attaching the first substrate 12 to the second substrate 28. The second substrate 28 includes a moisture absorbent material 22 to eliminate moisture and oxygen that may penetrate into a capsule of the organic EL layer 18. After etching a portion of the second substrate 28, the etched portion is filled with the absorbent material 22 and the filled absorbent material 22 is fixed by a holding element 25.

FIG. 2 is a schematic circuit diagram of an array layer of an organic electroluminescent display device according to the related art. In FIG. 2, a gate line 32 is formed along a first direction on a transparent insulating substrate 12, and a data line 34 is formed along a second direction intersected with the gate line 32, thereby defining a pixel region P. A power line 35 also is formed along the second direction and spaced apart from the data line 34. An insulating layer (not shown) is interposed between the gate line 32 and the data line 34.

In addition, a switching element $T_S$ is formed in the pixel region P. The switching element $T_S$ includes a switching gate electrode 36, the switching active layer 40, a switching source electrode 46 and a switching drain electrode 50. Further, a driving element $T_D$ electrically connects the switching element $T_S$. The driving element $T_D$ includes a driving gate electrode 38, a driving active layer 42, a driving source electrode 48 and a driving drain electrode 52. In particular, the switching gate electrode 36 is connected to the gate line 32, the switching source electrode 46 is connected to the data line 34, and the switching drain electrode 50 is connected to the driving gate electrode 38 through a first contact hole 54. The driving source electrode 48 is connected to the power line 35 through a second contact hole 56. In addition, the driving drain electrode 52 is connected to a first electrode 16 in the pixel region P. The power line 35 overlaps a first capacitor electrode 15 with the insulating layer interposed therebetween to form a storage capacitor $C_{ST}$.

FIG. 3 is a schematic plan view of an organic electroluminescent display device according to the related art. In FIG. 3, a substrate 12 includes a data pad region "E" along a first side and a gate pad region "F" along a second side adjacent to the first side. A power input pad 70 is formed at an edge portion of the substrate 12. The power input pad 70 is connected to a power line (not shown) and an electric power is supplied to a driving element through the power input terminal 70 and the power line. In addition, a ground line 60 is formed along third and fourth sides of the substrate 12. The ground line 60 is connected to a second electrode (not shown) and a common voltage is supplied to the second electrode through the ground line 60.

FIG. 4A is a schematic cross-sectional view along IVa-IVa of FIG. 2, and FIG. 4B is a schematic cross-sectional view along IVb-IVb of FIG. 3. In FIGS. 4A and 4B, a driving thin film transistor (TFT) $T_D$ including a driving gate electrode 38, a driving active layer 42, a driving source electrode 56 and a driving drain electrode 52 is formed on a substrate 12. An insulating layer 57 is formed on the driving TFT $T_D$ and a first electrode 16 connected to the driving drain electrode 52 is formed on the insulating layer 57. An organic luminescent layer 18 for emitting light of a specific color is formed on the first electrode 16 and a second electrode 20 is formed on the organic luminescent layer 18.

In addition, a storage capacitor is formed to be electrically parallel to the driving TFT $T_D$ and includes first and second capacitor electrodes 15 and 35, wherein a portion of a power line overlapping the first capacitor electrode 15 is used as the second capacitor electrode 35. The second capacitor electrode 35 is connected to the driving source electrode 56 and the second electrode 20 is formed on an entire surface of the substrate 12 having the driving TFT $T_D$, the storage capacitor, and the organic luminescent layer 18.

A ground line 60 is formed in a periphery of the substrate 12. The ground line 60 is formed of the same material as the driving source electrode 56, the driving drain electrode 52 and the power line 35. In addition, the ground line 60 is connected to the second electrode 20 through a plurality of contact holes 52 and a common voltage is, supplied to the second electrode 20 through the ground line 60. Since the second electrode 20 is formed through an evaporation method using a shadow mask, the second electrode 20 is porous and a poor hardness. Moreover, the ground line 60 and the second electrode 20 are individually formed by independent processes. Thus, the ground line 60 is not simultaneously formed with the second electrode 20.

The organic luminescent layer 18 between the first and second electrodes 16 and 20 may be formed of a single layer or a multiple layer. The organic luminescent layer 18 of a multiple layer includes an emission layer 18a, a hole transporting layer (HTL) 18b, a hole injecting layer (HIL) 18c, an electron transporting layer (ETL) 18d and an electron injecting layer (EIL) 18e. The HTL 18b and the HIL 18c are interposed between the first electrode 16 and the emission layer 18a, and the ETL 18d and the EIL 18e are interposed between the second electrode 20 and the emission layer 18a. The HIL 18c and the EIL 18e shift a Fermi level, thereby moving holes and electrons easily.

However, since the EIL 18e and the second electrode 20 are formed by one shadow mask, the EIL 18e is interposed between the ground line 60 and the second electrode 20. In particular, the EIL 18e is formed of one of fluoride compound and oxide compound, such as LiF and $Li_2O_2$. As a result, the EIL 18e is not conductive and functions as a resistor between the second electrode 20 and the ground line 60. Accordingly, heat is generated between the second electrode 20 and the ground line 60 because the EIL 18e functions as a resistor. Thus, the organic electroluminescent display device according to the related art deteriorates faster due to heat, thereby shortening product life span.

SUMMARY OF THE INVENTION

Accordingly, the present invention is directed to an organic electroluminescent display device and a method of fabricating the same that substantially obviate one or more of the problems due to limitations and disadvantages of the related art.

An object of the present invention is to provide an organic electroluminescent display device having an improved display quality and a lengthened lifetime by eliminating an electron injecting layer between a ground line and a cathode.

Another object of the present invention is to provide an organic electroluminescent display device where a contact resistance at a periphery of a substrate is reduced, thereby preventing a deterioration of an organic electroluminescent diode.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent display device includes an array element layer formed on a substrate, the array element layer including a switching element, a driving element, a first electrode, an organic luminescent layer, and a second electrode, and a ground line formed on the substrate, the ground line directly contacting the second electrode.

In another aspect, an organic electroluminescent display device includes an array element layer formed on a substrate, the array element layer including a switching element, a driving element, a first electrode, an organic luminescent layer, and a second electrode, a ground line formed on the substrate, and an interposition layer formed on the ground line, the second electrode contacting the ground line through the interposition layer.

In yet another aspect, a method of fabricating an organic electroluminescent device includes forming an array element layer on a substrate, the array element layer including a switching element, a driving element, a first electrode, an organic luminescent layer, and a second electrode, forming a ground line formed on the substrate, and exposing a portion of the ground line after forming the organic luminescent layer and before forming the second electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

FIGS. 5A to 5E are schematic cross-sectional views showing a fabricating process of a switching element for an organic electroluminescent display device according to an embodiment of the present invention, FIGS. 6A to 6E are schematic cross-sectional views showing a fabricating process of a driving element for an organic electroluminescent display device according to an embodiment of the present invention, and FIGS. 7A to 7E are schematic cross-sectional views showing a fabricating process of a ground line and a cathode for an organic electroluminescent display device according to an embodiment of the present invention.

Figure 1:
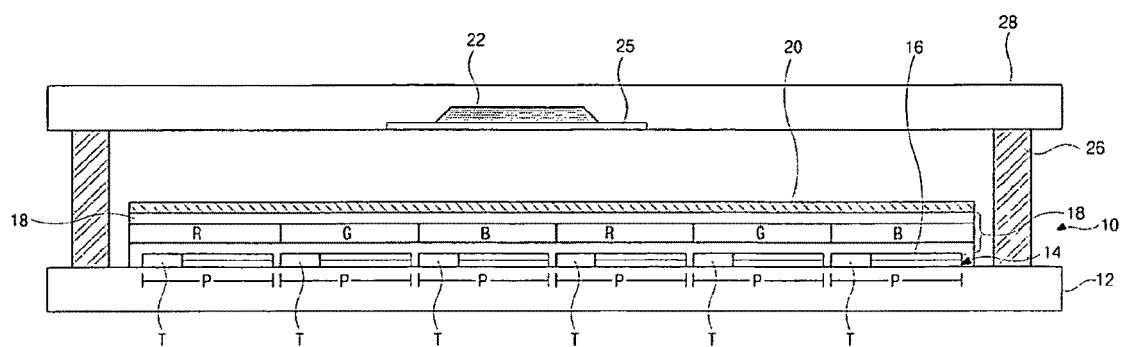
FIG. 1 is a schematic cross-sectional view of an organic electroluminescent display device according to the related art.
Figure 2:
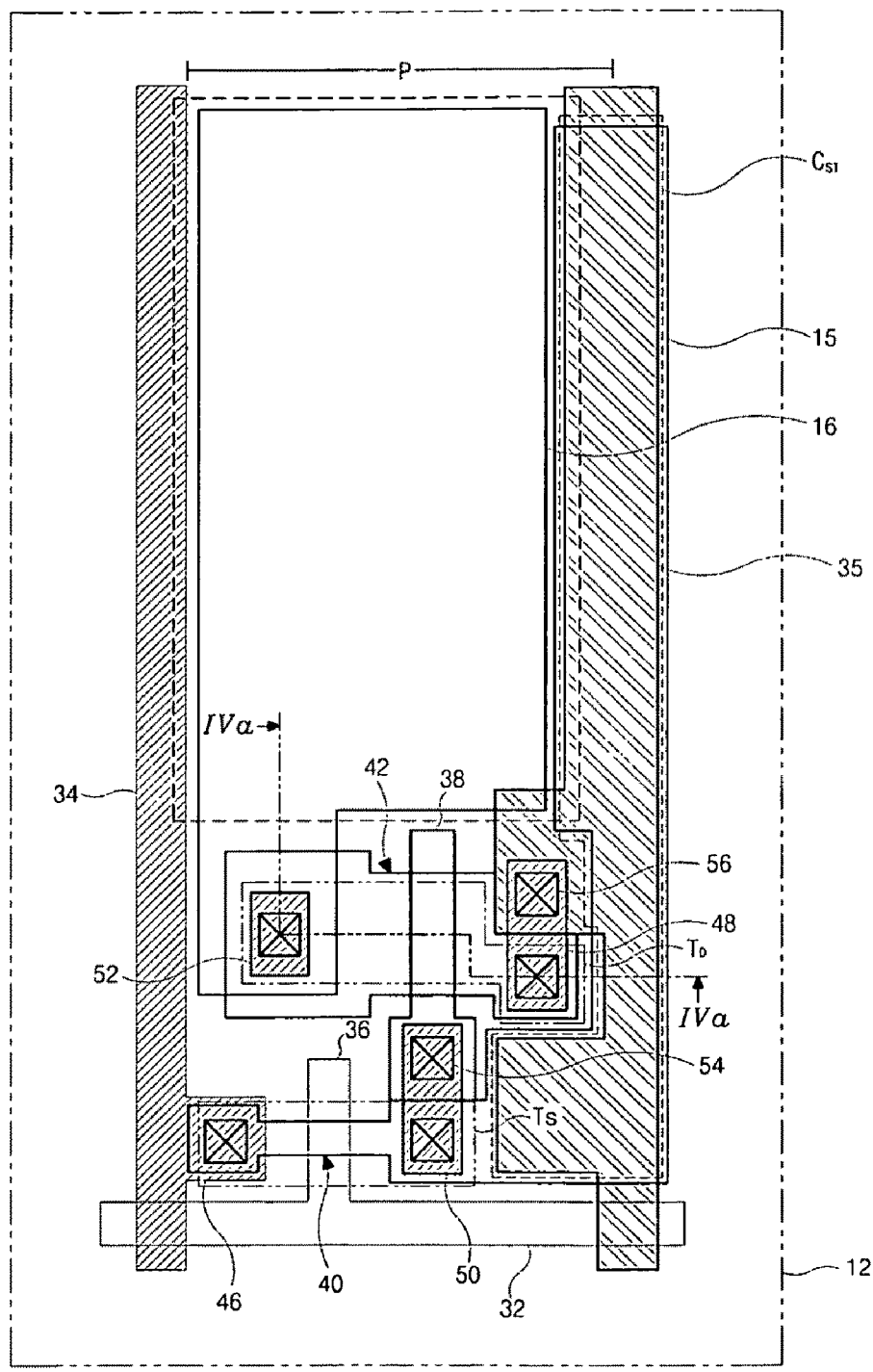
FIG. 2 is a schematic circuit diagram of an array layer of an organic electroluminescent display device according to the related art.
Figure 3:
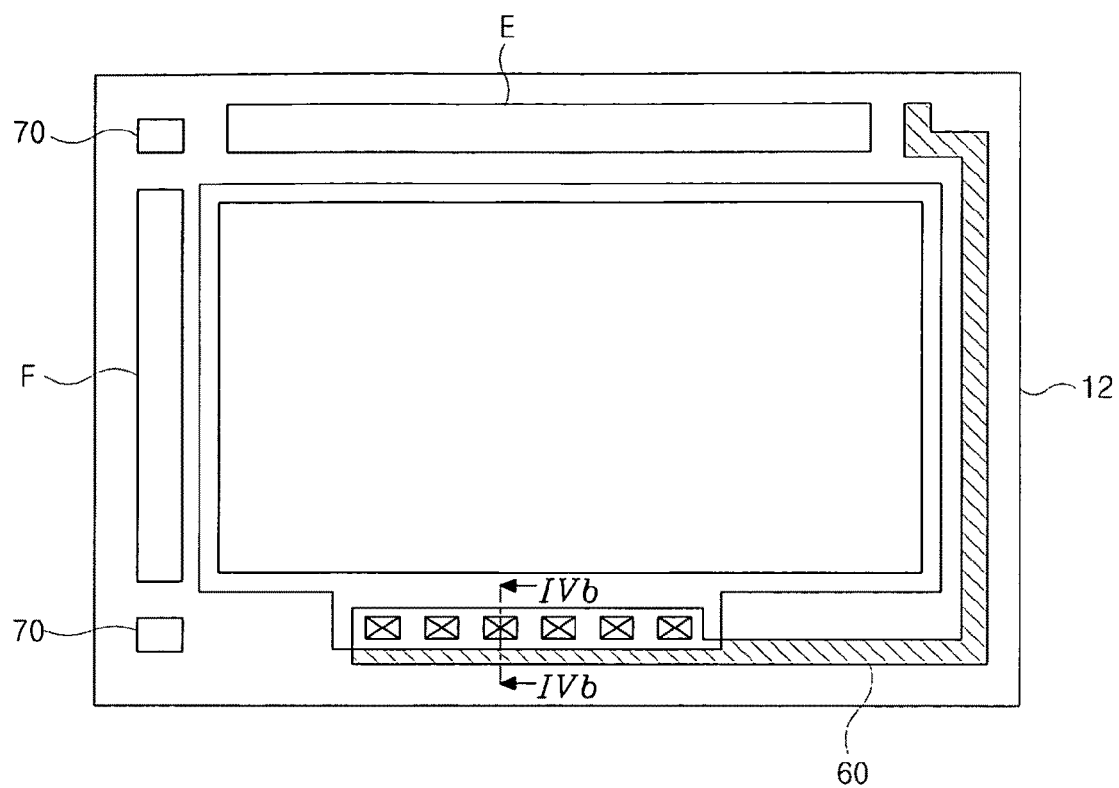
FIG. 3 is a schematic plan view of an organic electroluminescent display device according to the related art.
Figure 4A:
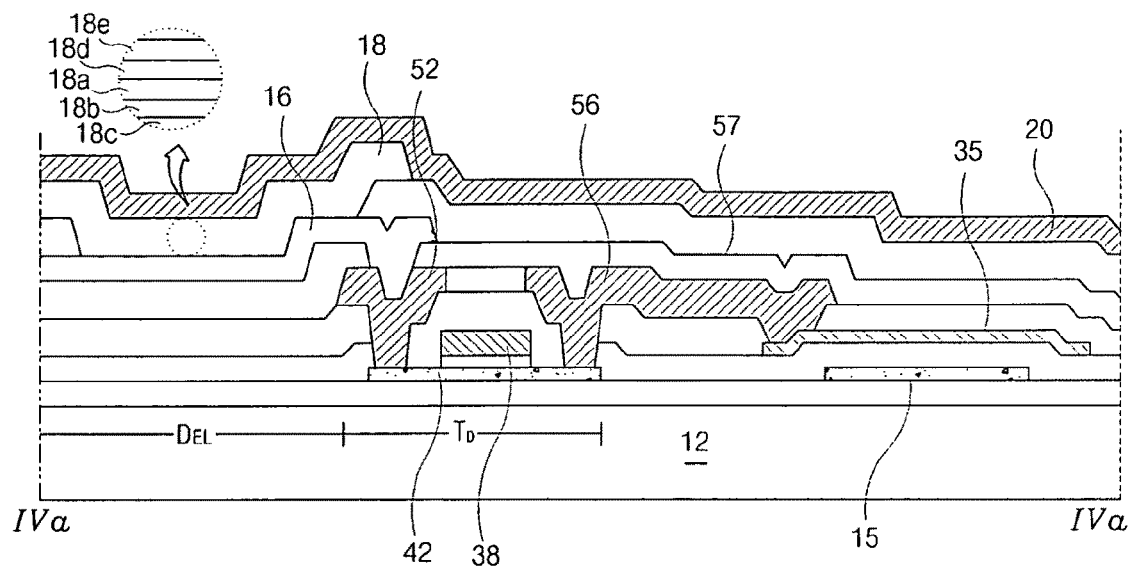
FIG. 4A is a schematic cross-sectional view along IVa-IVa of FIG. 2.
Figure 4B:
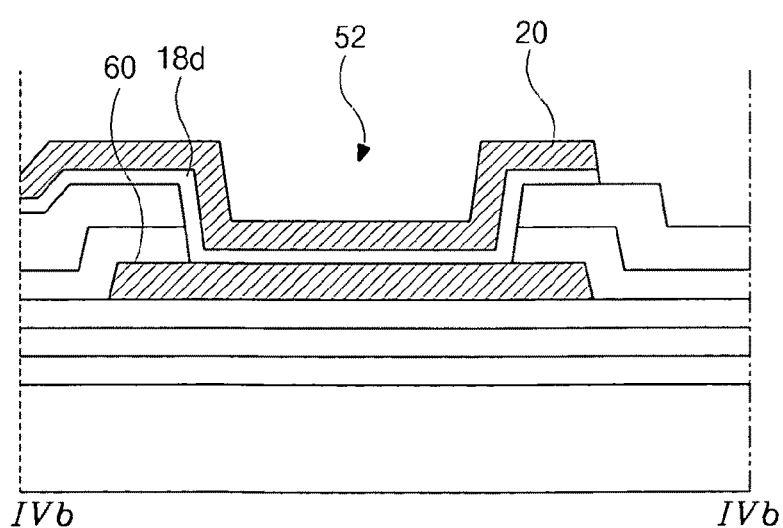
FIG. 4B is a schematic cross-sectional view along IVb-IVb of FIG. 3.
Figure 5A:
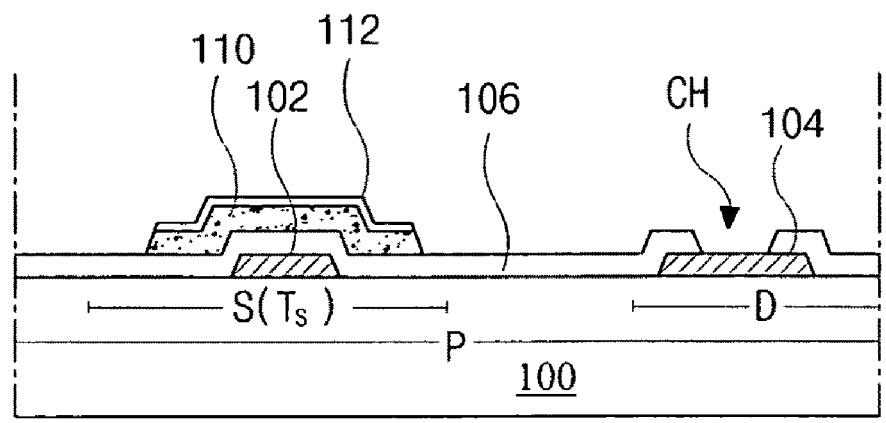
FIGS. 5A to 5E are schematic cross-sectional views showing a fabricating process of a switching element for an organic electroluminescent display device according to an embodiment of the present invention.
Figure 6A:
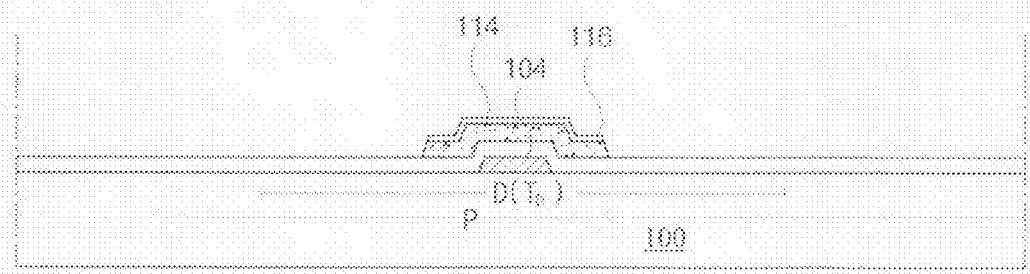
FIGS. 6A to 6E are schematic cross-sectional views showing a fabricating process of a driving element for an organic electroluminescent display device according to an embodiment of the present invention.
Figure 7A:
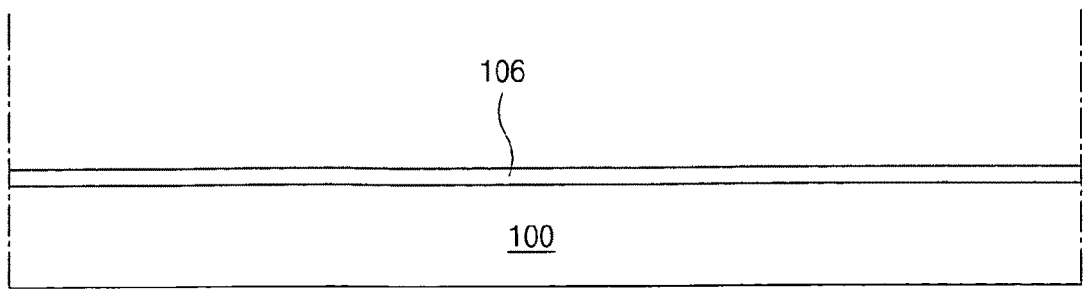
FIGS. 7A to 7E are schematic cross-sectional views showing a fabricating process of a ground line and a cathode for an organic electroluminescent display device according to an embodiment of the present invention.

In FIGS. 5A, 6A and 7A, a substrate 100 has a display region and a non-display region at a periphery of the display region. In particular, the display region includes a pixel region P, a driving region D and a switching region S. A gate line (not shown), a switching gate electrode 102 and a driving gate electrode 104 are formed on the substrate 100 by depositing and patterning a first conductive metallic material. The first conductive metallic material may include one of aluminum (Al), aluminum alloy, tungsten (W), copper (Cu), molybdenum (Mo) and titanium (Ti). Further, the switching gate electrode 102 and the driving gate electrode 104 are formed in the switching region S and the driving region D, respectively.

In addition, a gate insulating layer 106 is formed on the switching gate electrode 102 and the driving gate electrode 104. The gate insulating layer 106 may be formed by depositing an inorganic insulating material, such as silicon nitride (SiNx) and silicon oxide ($SiO_2$) on the substrate 100. Then, a switching active layer 110 and a switching ohmic contact layer 112 are sequentially formed on the gate insulating layer 106 over the switching gate electrode 102 in the switching region S (FIG. 5A), and a driving active layer 114 and a driving ohmic contact layer 116 are sequentially formed on the gate insulating layer 106 over the driving gate electrode 104 in the driving region D (FIG. 6A). In particular, the gate insulating layer 106 has a gate contact hole CH exposing a portion of the driving gate electrode 104 in the driving region D.

Figure 5B:
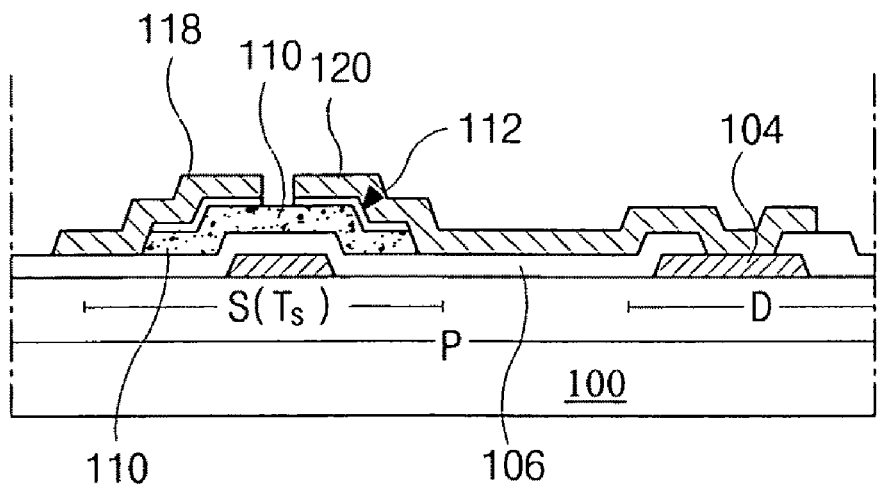
Figure 6B:
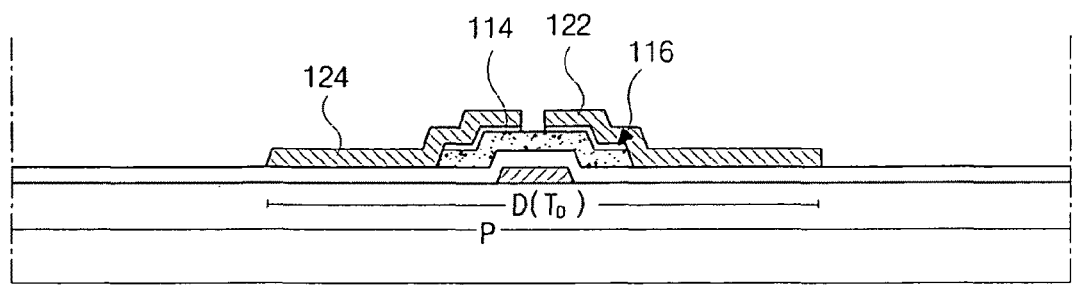
Figure 7B:
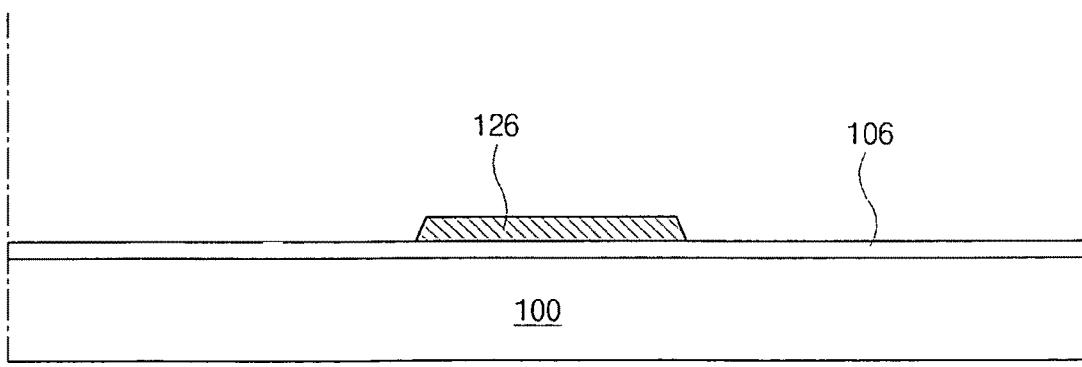

In FIGS. 5B and 6B, a switching source electrode 118, a switching drain electrode 120, a driving source electrode 122 and a driving drain electrode 124 are formed by depositing and patterning a second conductive metallic material. The second conductive metallic material may include one of aluminum (Al), aluminum alloy, tungsten (W), copper (Cu), molybdenum (Mo) and titanium (Ti). In particular, the switching source electrode 118 and the switching drain electrode 120 are formed on the switching ohmic contact layer 112 in the switching region S (FIG. 5B), and the driving source electrode 122 and the driving drain electrode 124 are formed on the driving ohmic contact layer 116 in the driving region D (FIG. 6B). In addition, the switching drain electrode 120 may extend into the driving region D and may contact the driving gate electrode 104 through the gate contact CH. Further, as shown in FIG. 7B, a ground line 126 is formed at a periphery of the substrate 100.

Figure 5C:
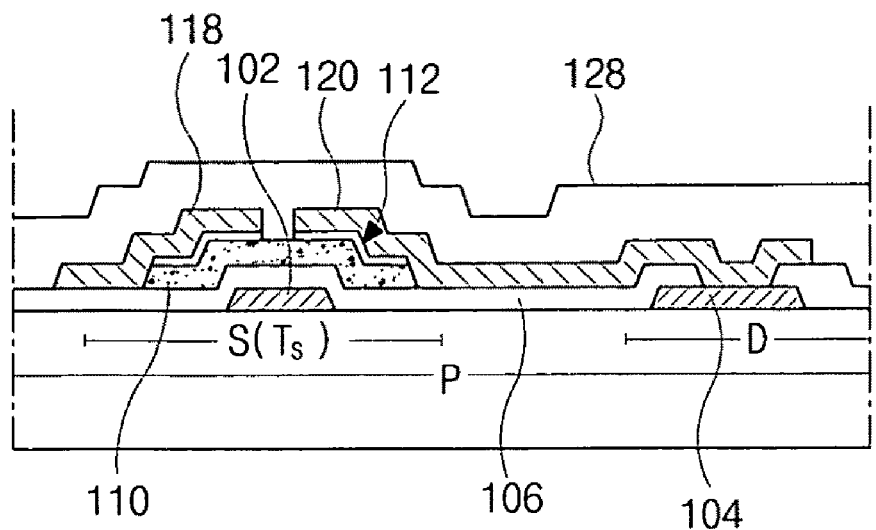
Figure 6C:
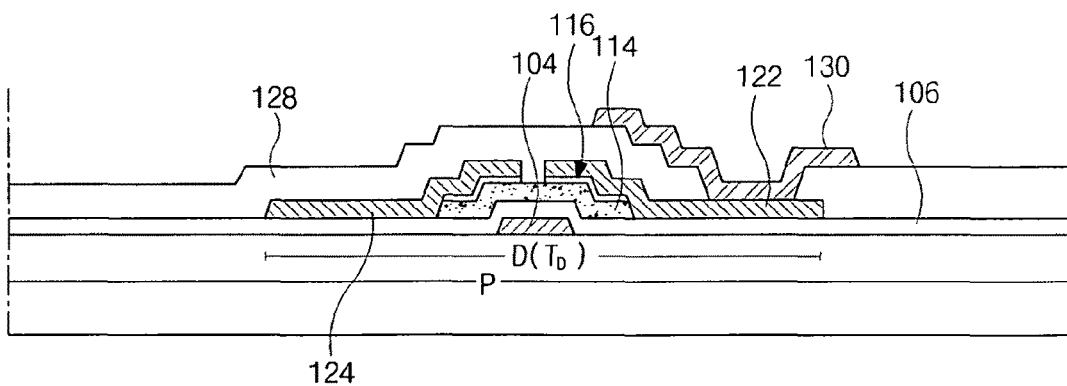
Figure 7C:
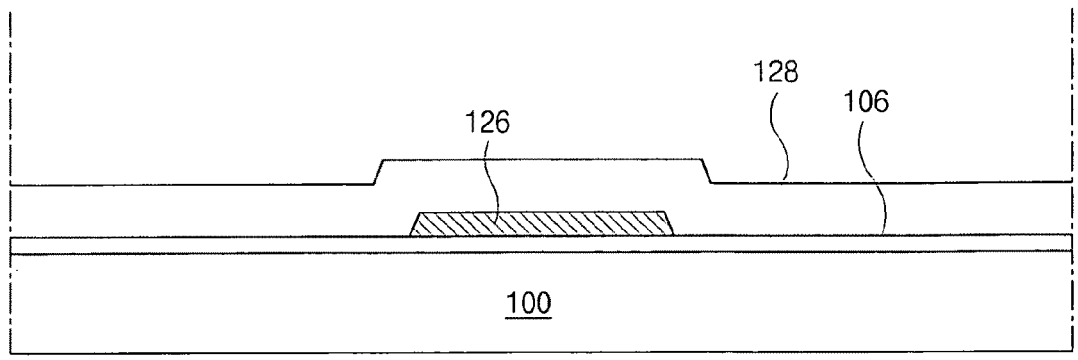

In FIGS. 5C, 6C and 7C, a first passivation layer 128 is formed on the switching source electrode 118, the switching drain electrode 120, the driving source electrode 122 and the driving drain electrode 124. The first passivation layer 128 may be formed by depositing an inorganic insulating material such as silicon nitride (SiNx) and silicon oxide ($SiO_2$) on the substrate 100. The first passivation layer 128 has a source contact hole exposing the driving source electrode 122 in the driving region D. Then, a power line 130 is formed on the first passivation layer 128 by depositing and patterning a third conductive metallic material (FIG. 6C). The third conductive metallic material may include one of aluminum (Al), aluminum alloy, tungsten (W), copper (Cu), molybdenum (Mo) and titanium (Ti). The power line 130 is connected to the driving source electrode 122 through the source contact hole.

Figure 5D:
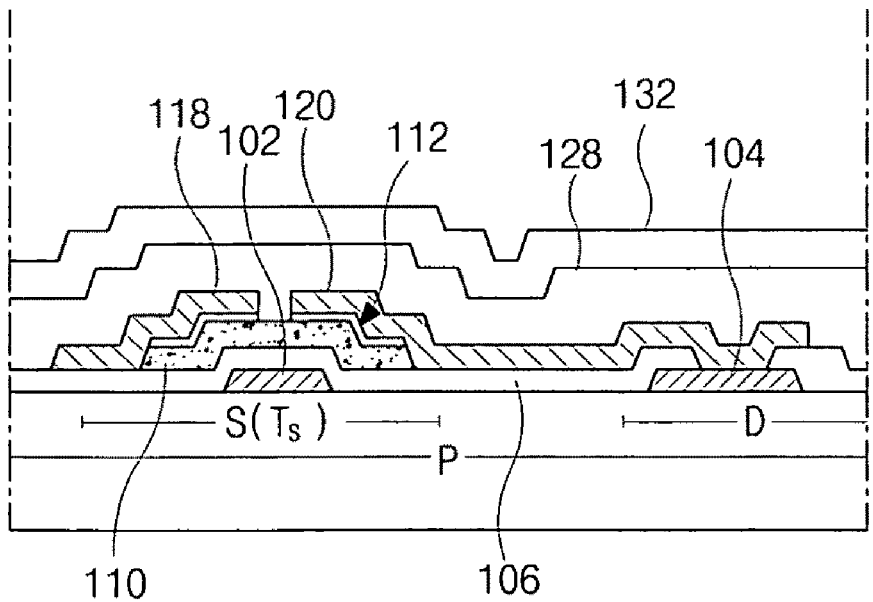
Figure 6D:
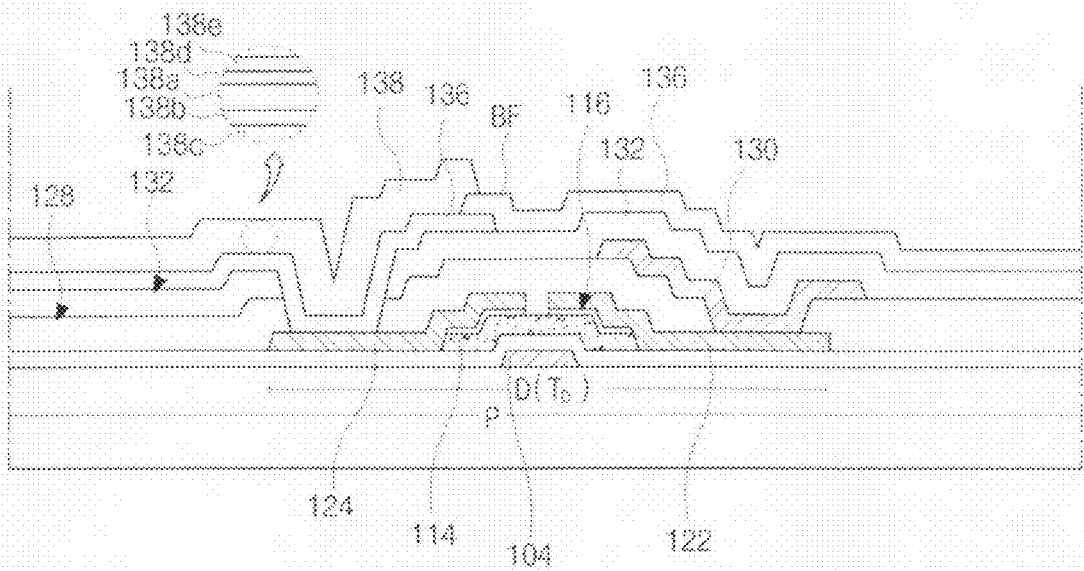
Figure 7D:
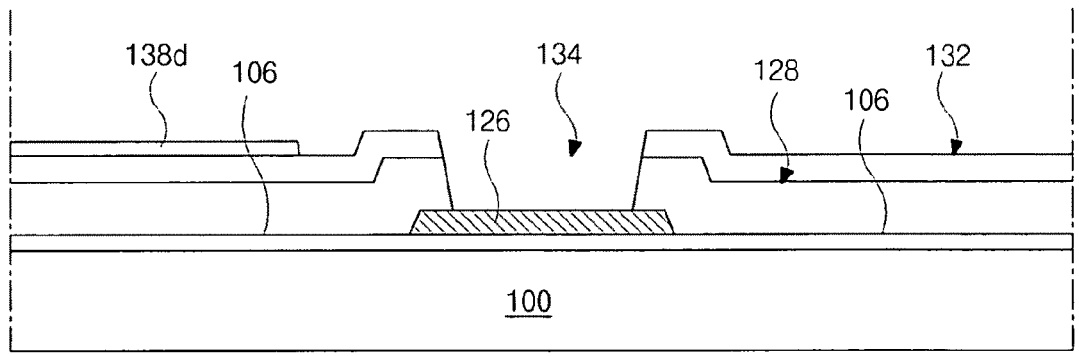

In FIGS. 5D, 6D and 7D, a second passivation layer 132 is formed on the power line 130. The second passivation layer 132 may be formed by depositing an organic insulating material, such as benzocyclobutene (BCB) and acrylic resin. The second passivation layer 132 has a drain contact hole exposing the driving drain electrode 124 and a ground contact hole 134 exposing the ground line 126.

In addition, a first electrode 136 is formed on the second passivation layer 132 in the pixel region P (FIG. 6D). The first electrode 136 may function as an anode and may be formed by depositing and patterning a metallic material having a first work function. For example, the metallic material having the first work function may include one of indium-tin-oxide (ITO) and indium-zinc-oxide (IZO). Further, a buffer layer BF is formed on the first electrode 136. The buffer layer BF has an open portion exposing the first electrode 136. Then, an organic luminescent layer 138 is formed on the buffer layer BF contacting the first electrode 136. The organic luminescent layer 138 emitting light of red (R), green (G) and blue (B) colors is alternately disposed in the pixel region P.

The organic luminescent layer 138 may be formed of a single layer or a multiple layer. For instance, as shown in FIG. 6D, the organic luminescent layer 138 of a multiple layer may include an emission layer 138a, a hole transporting layer (HTL) 138b, a hole injecting layer (HIL) 138c, an electron transporting layer (ETL) 138d, and an electron injecting layer (EIL) 138e. The HTL 138b and the HIL 138c may be interposed between the first electrode 136 and the emission layer 138a, and the ETL 138d and the EIL 138e may be sequentially formed on the emission layer 138a. In particular, the EIL 138e may be formed by using a first shadow mask. The first shadow mask has an open portion exposing the pixel region P and a blocking portion shielding the ground line 126. Accordingly, the EIL 138e is not formed on the ground line 126 and the ground line 126 is exposed through the EIL 138e.

Figure 5E:
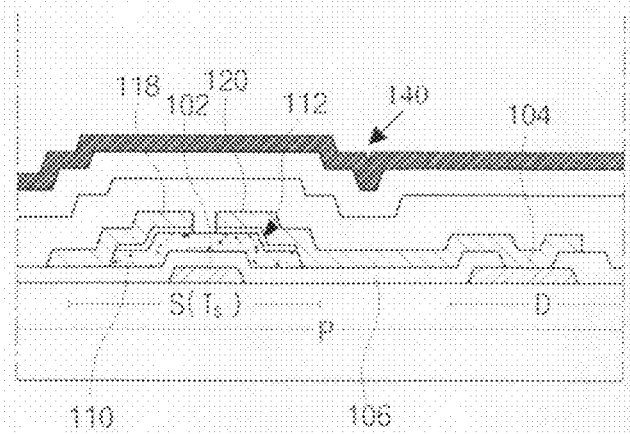
Figure 6E:
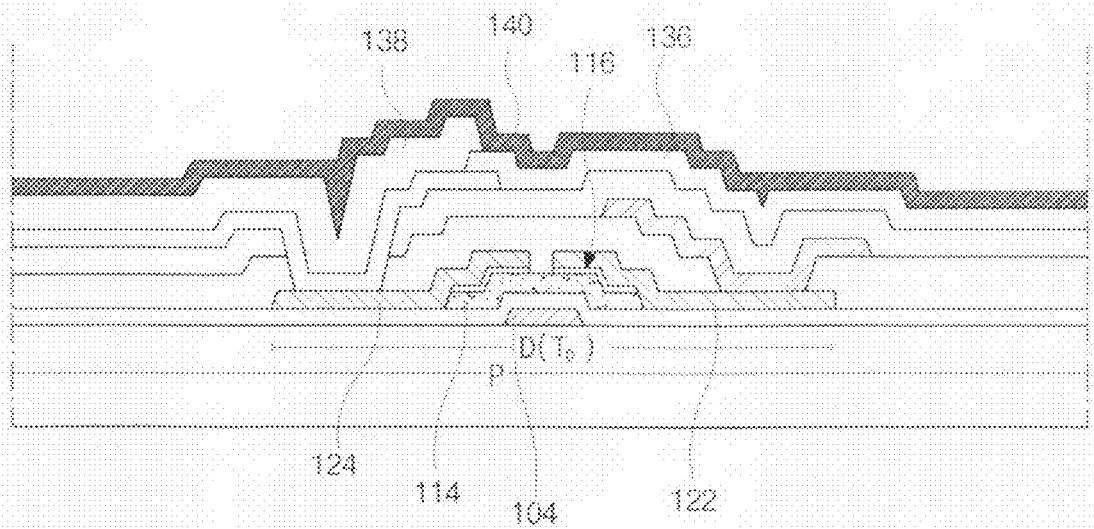
Figure 7E:
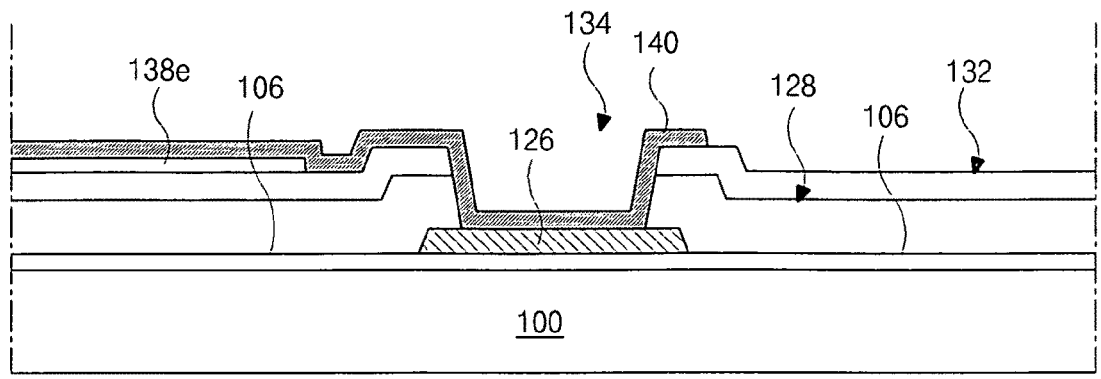

In FIGS. 5E, 6E and 7E, a second electrode 140 is formed on the second passivation layer 132 and the organic luminescent layer 138. The second electrode 140 may function as a cathode and may be formed by depositing and patterning a metallic material having a second work function. For example, the metallic material having the second work function may include one of calcium (Ca), aluminum (Al) and magnesium (Mg). The second work function may be smaller than the first work function. In particular, the second electrode 140 may be formed by using a second shadow mask, and the second shadow mask may be different from the first shadow mask. The second mask may have an open portion exposing the pixel region and the ground line 126. Accordingly, the second electrode 140 is formed on the ground line 126 and directly contacts the ground line 126 without interposition of the EIL 138e.

Figure 8:
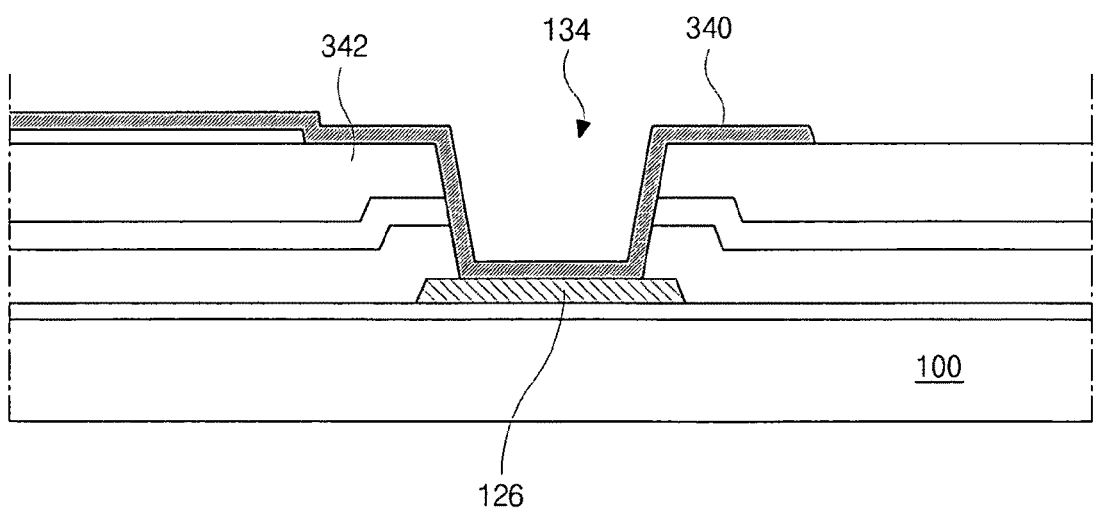
FIG. 8 is a schematic cross-sectional view showing a ground line and a cathode for an organic electroluminescent display device according to another embodiment of the present invention.

FIG. 8 is a schematic cross-sectional view showing a ground line and a cathode for an organic electroluminescent display device according to another embodiment of the present invention. As shown in FIG. 8, a planarization layer 342 may be further formed before forming a first electrode 136 (of FIG. 6D) on a substrate 100. Accordingly, a second electrode 340 may be formed on the planarization layer 342 and may contact the ground line 126 through a contact hole of a first passivation layer 128 (of FIG. 7E), a second passivation layer 132 (of FIG. 7E) and the planarization layer 342.

Figure 9:
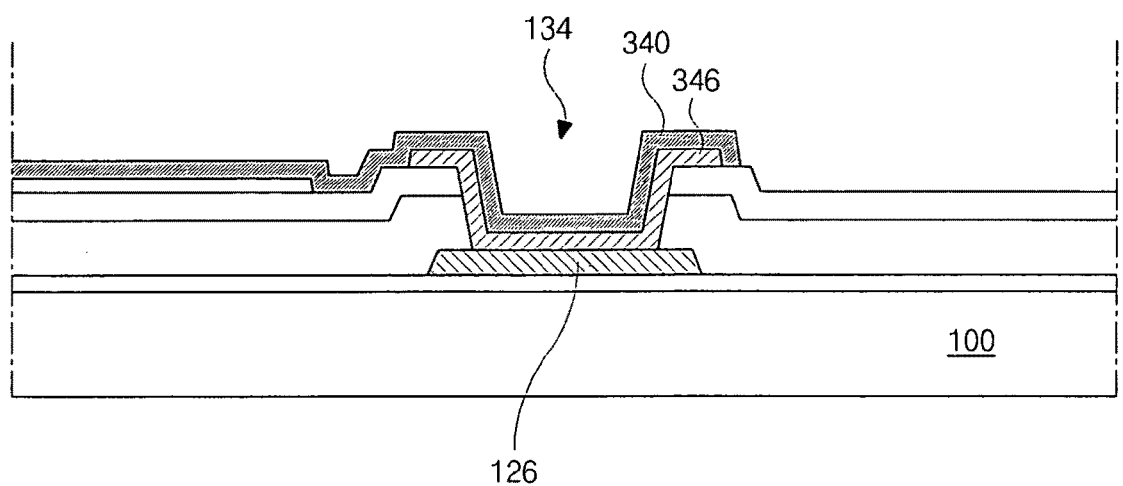
FIG. 9 is a schematic cross-sectional view showing a ground line and a cathode for an organic electroluminescent display device according to another embodiment of the present invention.

FIG. 9 is a schematic cross-sectional view showing a ground line and a cathode for an organic electroluminescent display device according to another embodiment of the present invention. As shown in FIG. 9, an interposition layer 346 may be further formed on a ground line 126 to reduce a contact resistance between the ground line 126 and a second electrode 340. For instance, the interposition layer 346 may include a conductive material reducing the contact resistance between the ground line 126 and the second electrode 340. Accordingly, the second electrode 340 may be connected to the ground line 126 through the interposition layer 346.

Figure 10:
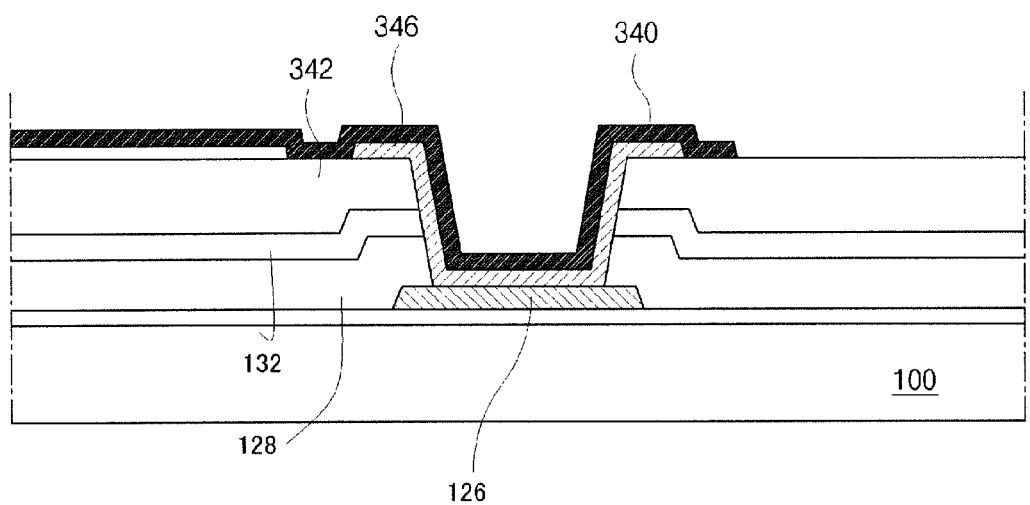
FIG. 10 is a schematic cross-sectional view showing a ground line and a cathode for an organic electroluminescent display device according to another embodiment of the present invention.
Figure 11:
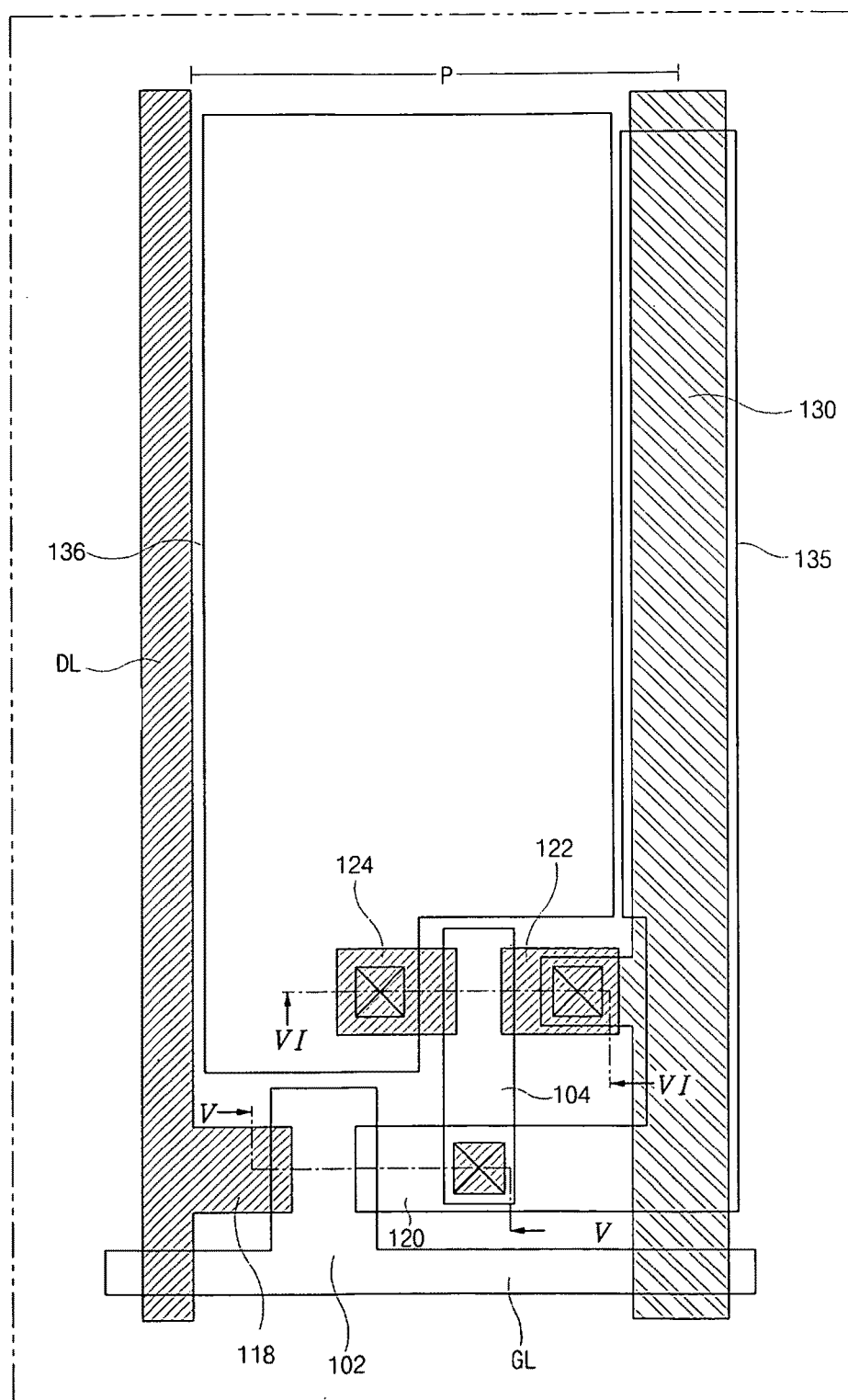
FIG. 11 is a schematic plane view of a pixel region of an organic electroluminescent display device according to the present invention.
Figure 12:
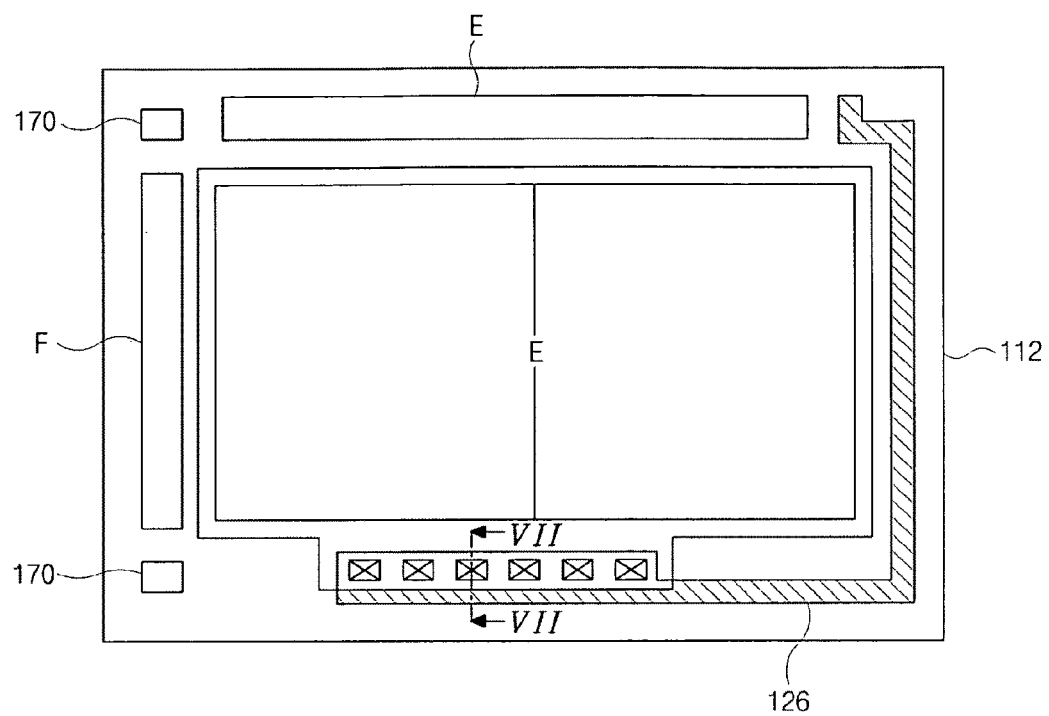
FIG. 12 is a schematic plane view of an organic electroluminescent display device according to the present invention.

FIG. 10 is a schematic cross-sectional view showing a ground line and a cathode for an organic electroluminescent display device according to another embodiment of the present invention. As shown in FIG. 10, a planarization layer 342 may be formed before forming a first electrode 136 (of FIG. 6D) and an interposition layer 346 may be further formed on the planarization layer 342. In particular, the interposition layer 346 may contact a ground line 126 through a contact hole of a first passivation layer 128 (of FIG. 7E), a second passivation layer 132 (of FIG. 7E) and the planarization layer 342. As a result, the interposition layer 346 may reduce a contact resistance between the ground line 126 and a second electrode 340.

In an organic electroluminescent display device according to an embodiment of the present invention, since a cathode directly contacts a ground line at a periphery of a substrate without interposition of an electron injection layer (EIL) of fluoride compound or oxide compound, a contact resistance between the ground line and the cathode is reduced. Accordingly, a heat generation due to the high contact resistance is reduced and deterioration of an organic electroluminescent display device is prevented. As a result, a lifetime of an organic electroluminescent display device is lengthened.

Further, an organic electroluminescent display device according to an embodiment of the present invention also may include an interposition layer between the cathode and the ground line, thereby further reducing the contact resistance between the cathode and the ground line.

It will be apparent to those skilled in the art that various modifications and variations can be made in the organic electroluminescent display device and the method of fabricating the same of the present invention without departing from the spirit or scope of the invention. Thus, it is intended that the present invention covers the modifications and variations of this invention provided they come within the scope of the appended claims and their equivalents.

What is claimed is:

1. A method of fabricating an organic electroluminescent device, comprising:
   forming an array element layer on a substrate, the array element layer including a switching element, a driving element, a first electrode, an organic luminescent layer, and a second electrode;
   forming a ground line at a periphery of the substrate;
   forming a planarization layer on the ground line;
   exposing a portion of the ground line by forming a ground contact hole through the planarization layer;
   forming an interposition layer on the portion of the ground line; and
   forming the second electrode on the interposition layer and planarization layer, the second electrode electrically connected to the ground line through the interposition layer, wherein the interposition layer is for reducing a contact resistance between the ground line and the second electrode.

2. The method according to claim 1, wherein the step of forming the planarization layer includes forming the planarization layer under the first electrode, the ground line being exposed through the ground contact hole in the planarization layer.

3. The method according to claim 1, wherein the step of forming the switching element includes forming a switching gate electrode, a switching source electrode and switching drain electrode, and the step of forming the driving element includes forming a driving gate electrode, a driving source electrode and a driving drain electrode, the ground line, the switching source electrode, the switching drain electrode, the driving source electrode and the driving drain electrode being formed by the same process step.

4. The method according to claim 1, wherein the step of forming the organic luminescent layer comprises:
   forming a hole injection layer on the first electrode;
   forming a hole transporting layer on the hole injection layer;
   forming an emission layer on the hole transporting layer;
   forming an electron transporting layer on the emission layer; and
   forming an electron injection layer on the electron transporting layer,
   wherein the electron injection layer is not on the ground line.

5. The method according to claim 4, wherein the electron injection layer is formed using a first shadow mask shielding the ground line and the second electrode is formed using a second mask exposing the ground line.

6. A method of fabricating an organic electroluminescent display device, comprising:
   forming an array element layer on a substrate,
      the array element layer comprising;
         a) a switching element, a driving element;
         b) an organic luminescent device includes an emission layer interposed between a first electrode and a second electrode, an emission enhancement layer, wherein the emission enhancement layer is to improve the light emission capability of the organic luminescent device;
   forming a ground line on the substrate;
   forming a passivation layer on the ground line;
   forming a ground contact hole through the passivation layer to expose a portion of the ground line;
   forming the emission enhancement layer, wherein the emission enhancement layer is electrically insulated from the ground line.

7. A method according to claim 6, wherein the emission enhancement layer includes at least one of a hole injection layer, a hole transporting layer, an electron transporting layer and an electron injection layer.

* * * * *